United States Patent
Sivasubramaniam (10) Patent No.: US 7,711,334 B2
(45) Date of Patent: May 4, 2010

(54) HIGH LINEARITY, LOW NOISE FIGURE, FRONT END CIRCUIT WITH FINE STEP GAIN CONTROL

(75) Inventor: Janakan Sivasubramaniam, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 516 days.

(21) Appl. No.: 11/690,149

(22) Filed: Mar. 23, 2007

(65) Prior Publication Data

US 2008/0233913 A1    Sep. 25, 2008

(51) Int. Cl.
*G06F 3/033* (2006.01)
*H04B 1/18* (2006.01)

(52) U.S. Cl. .................... 455/130; 455/293; 455/280

(58) Field of Classification Search .................. 455/130, 455/323, 330, 326, 189.1, 293, 311, 280
See application file for complete search history.

(56) References Cited

U.S. PATENT DOCUMENTS

| | | | |
|---|---|---|---|
| 6,744,320 B2 | 6/2004 | Nguyen et al. | |
| 6,781,467 B2 * | 8/2004 | Sun | 330/295 |
| 7,035,616 B2 * | 4/2006 | Reynolds | 455/326 |
| 7,088,169 B2 * | 8/2006 | Erba et al. | 327/359 |
| 7,317,357 B1 * | 1/2008 | Zou | 330/254 |
| 7,403,071 B2 * | 7/2008 | Hollenbeck et al. | 330/254 |
| 7,471,140 B2 * | 12/2008 | Salerno | 327/551 |
| 7,529,529 B2 * | 5/2009 | Taylor | 455/130 |
| 7,541,875 B2 * | 6/2009 | Taylor et al. | 330/311 |
| 7,542,812 B2 * | 6/2009 | Stroili et al. | 700/90 |
| 2003/0027543 A1 | 2/2003 | Takaki | |
| 2004/0036772 A1 | 2/2004 | Pugel et al. | |
| 2005/0265428 A1 * | 12/2005 | McCorkle | 375/130 |
| 2006/0071845 A1 | 4/2006 | Stroili et al. | |

OTHER PUBLICATIONS

Ironi, A., "Mobile TV standards: One size doesn't fit all," http://www.totaltele.com/View.aspx?ID=91546&t=4, Apr. 17, 2007.

* cited by examiner

*Primary Examiner*—Sonny Trinh
(74) *Attorney, Agent, or Firm*—Rahman LLC (57) ABSTRACT

A system, method, and electrical circuit comprises a LNA signal line path comprising a LNA and a first signal mixer operatively connected to the LNA. The circuit further comprises an attenuator signal line path comprising an attenuator and a second signal mixer operatively connected to the attenuator; a radio frequency (RF) power detector operatively connected to an output of each of the LNA and the attenuator, wherein the RF power detector is adapted to vary a front end power gain of the electrical circuit; and logic circuitry operatively connected to the RF power detector, wherein the logic circuitry is adapted to (i) select transmission of a signal through only one of the LNA signal line path or the attenuator signal line path, and (ii) output the selected signal.

20 Claims, 10 Drawing Sheets

HIGH LINEARITY, LOW NOISE FIGURE, FRONT END CIRCUIT WITH FINE STEP GAIN CONTROL

BACKGROUND

1. Technical Field

The embodiments herein generally relate to gain control circuits, and, more particularly, to circuits used for improving the dynamic range with low noise figure at sensitivity and improve step gain in communication devices.

2. Description of the Related Art

Figure 1:
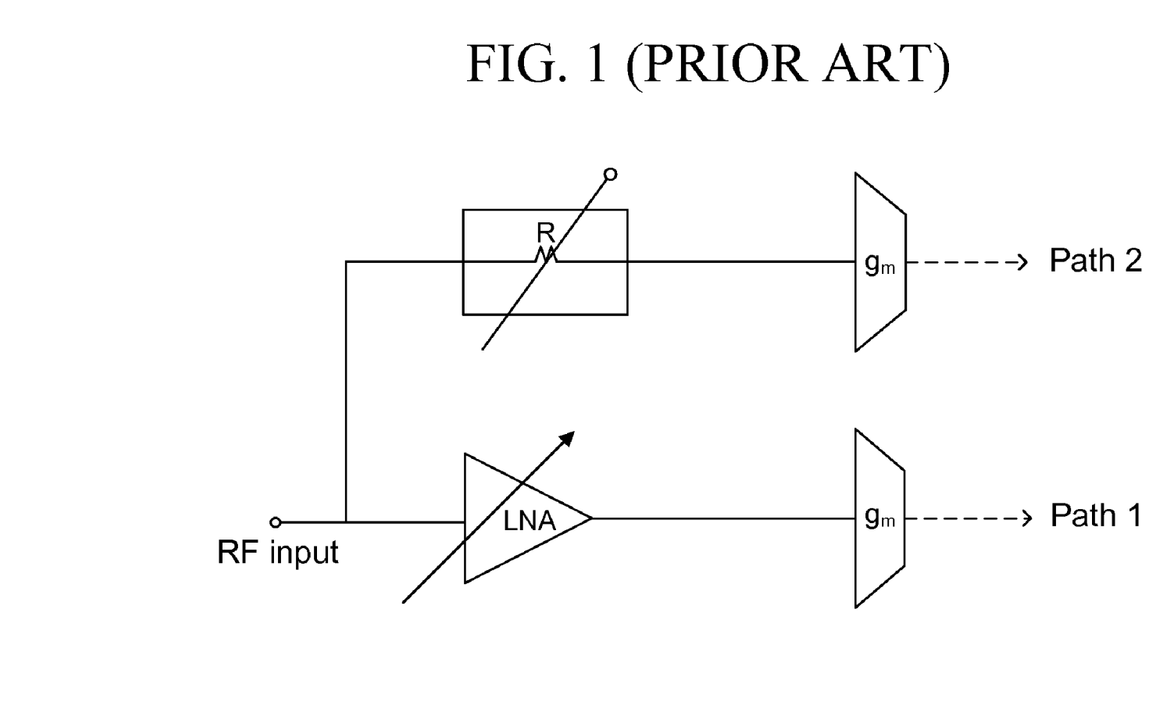
FIGS. 1 and 2 illustrate schematic diagrams of conventional electrical circuits.

As shown in FIG. 1, the tuner input goes to both a low noise amplifier (LNA) input and an attenuator input creating two separate signal paths (both paths have variable gain control). However, the gain control is continuous as in a baseband variable gain amplifier (VGA), which comes at the expense of inferior linearity at high signal levels. Moreover, fine stepping the gain allows for easier and smarter logic processing deciding how to step the front end gain.

Figure 2:
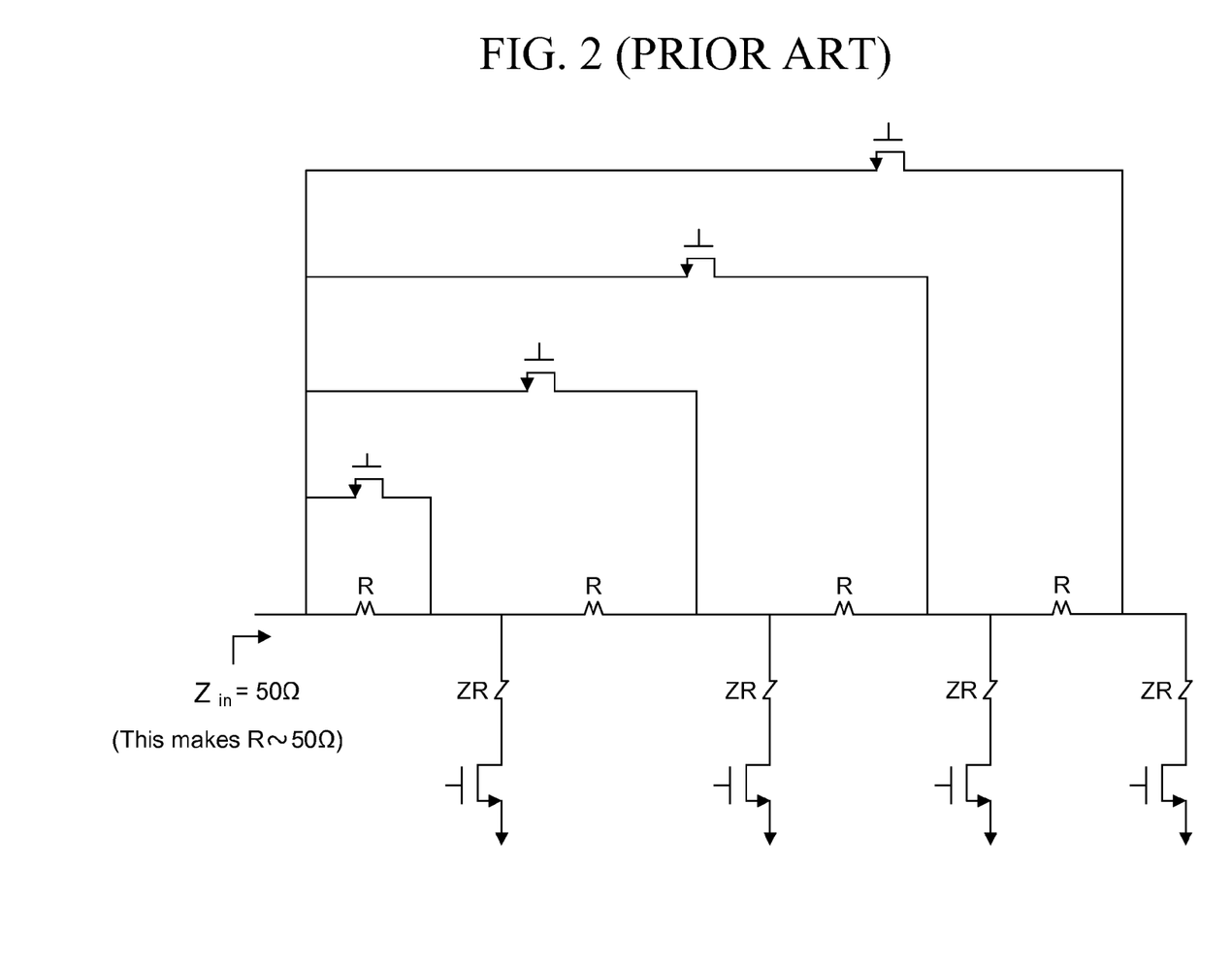

Conventionally, the attenuators have taken the form of R-2R ladders as shown in FIG. 2, which typically require switches both in series with the signal path as well as in a shunt configuration. Furthermore, matching requirements at the input often constrain the values of these resistors to be quite small. The repercussions are large transistor switches, which tend to dramatically limit the bandwidth of the circuit. Accordingly, there remains a need for a highly linear, low noise figure front end circuit that can provide fine step gain control.

SUMMARY

In view of the foregoing, an embodiment provides an electrical circuit comprising a LNA signal line path comprising a LNA and a first signal mixer operatively connected to the LNA. The circuit further comprises an attenuator signal line path comprising an attenuator and a second signal mixer operatively connected to the attenuator; a radio frequency (RF) power detector operatively connected to an output of each of the LNA and the attenuator, wherein the RF power detector is adapted to vary a front end power gain of the electrical circuit; and logic circuitry operatively connected to the RF power detector, wherein the logic circuitry is adapted to (i) select transmission of a signal through only one of the LNA signal line path or the attenuator signal line path, and (ii) output the selected signal.

Preferably, the logic circuitry is adapted to receive instructions from the RF power detector to switch between a LNA signal domain and an attenuator signal domain. Moreover, a power gain of the LNA is preferably stepped such that signal glitches through the outputted selected signal is minimized. The attenuator may comprise a matching resistor in shunt with a signal through the attenuator signal line path. Additionally, the attenuator may comprise a resistive divider configuration comprising transistor switches in shunt with a signal through the attenuator signal line path. The electrical circuit may further comprise a buffer operatively connected to the attenuator and adapted to lower an output capacitance of the attenuator. Also, the attenuator may be divided into sub-sections separated from one another by a buffer. Furthermore, each of the LNA signal line path and the attenuator signal line path may further comprise an up-down counter and a fine gain step counter in a feedback configuration to the up-down counter.

Another embodiment provides a system configured for a communications device, wherein the system comprises an antenna adapted to receive a RF signal; a matching network adapted to process the RF signal; and a LNA signal line path operatively connected to the matching network, wherein the LNA signal line path comprises a LNA; a first transconductor stage operatively connected to the LNA; and a first signal mixer operatively connected to the first transconductor stage. The system further comprises an attenuator signal line path operatively connected to the matching network, wherein the attenuator signal line path comprises an attenuator; a second transconductor stage operatively connected to the attenuator; and a second signal mixer operatively connected to the second transconductor stage.

The system further includes a RF power detector operatively connected to an output of each of the LNA and the attenuator, wherein the RF power detector is adapted to vary a front end power gain of the system; and logic circuitry operatively connected to the RF power detector, wherein the logic circuitry is adapted to (i) select transmission of a signal through only one of the LNA signal line path or the attenuator signal line path, and (ii) output the selected signal, wherein each of the LNA signal line path and the attenuator signal line path comprises a comparator adapted to create a hysterisis boundary for preventing power gain limit cycles from occurring in each of the LNA signal line path and the attenuator signal line path; an up-down counter operatively connected to the comparator; and a fine gain step counter in a feedback configuration to the up-down counter.

Preferably, the logic circuitry is adapted to receive instructions from the RF power detector to switch between a LNA signal domain and an attenuator signal domain. Preferably, a power gain of the LNA is stepped such that signal glitches through the outputted selected signal are minimized. Moreover, the attenuator may comprise a matching resistor in shunt with a signal through the attenuator signal line path. Also, the attenuator may comprise a resistive divider configuration comprising transistor switches in shunt with a signal through the attenuator signal line path. The system may further comprise a buffer operatively connected to the attenuator and adapted to lower an output capacitance of the attenuator. Additionally, the attenuator may be divided into sub-sections separated from one another by a buffer.

Another embodiment provides a method for fine gain stepping and voltage bias control in an electrical circuit, wherein the method comprises sending a first RF signal through a LNA signal line path, wherein the LNA signal line path comprises a LNA; a first transconductor stage operatively connected to the LNA; and a first signal mixer operatively connected to the first transconductor stage. The method further comprises sending a second RF signal through an attenuator signal line path, wherein the attenuator signal line path comprises an attenuator; a second transconductor stage operatively connected to the attenuator; and a second signal mixer operatively connected to the second transconductor stage. The method further comprises sending a signal output from each of the LNA and the attenuator to a RF power detector, wherein the RF power detector is adapted to vary a front end power gain of the electrical circuit; using logic circuitry to select transmission of a signal through only one of the LNA signal line path or the attenuator signal line path; and outputting the selected signal.

Preferably, the logic circuitry is adapted to receive instructions from the RF power detector to switch between a LNA signal domain and an attenuator signal domain. Moreover, a power gain of the LNA is preferably stepped such that signal glitches through the outputted selected signal is minimized. The method may further comprise buffering an output signal from the attenuator in order to lower an output capacitance of the attenuator. Additionally, the method may further comprise dividing the attenuator into sub-sections separated from one another by a buffer.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a highly linear, low noise figure front end circuit that can provide fine step gain control. The embodiments herein achieve this by providing a front end circuit that allows a switch between two RF paths to improve linearity at high signal power. The low noise figure regular LNA path is combined with a high linearity attenuator path. An RF power detector uses a signal power threshold to switch between the two paths. Both the LNA and attenuator are fine stepped in gain over a large gain control. Moreover, logic circuitry integrates this gain control along with VGA control. Referring now to the drawings, and more particularly to FIGS. 3 through 9, where similar reference characters denote corresponding features consistently throughout the figures, there are shown preferred embodiments.

Figure 3:
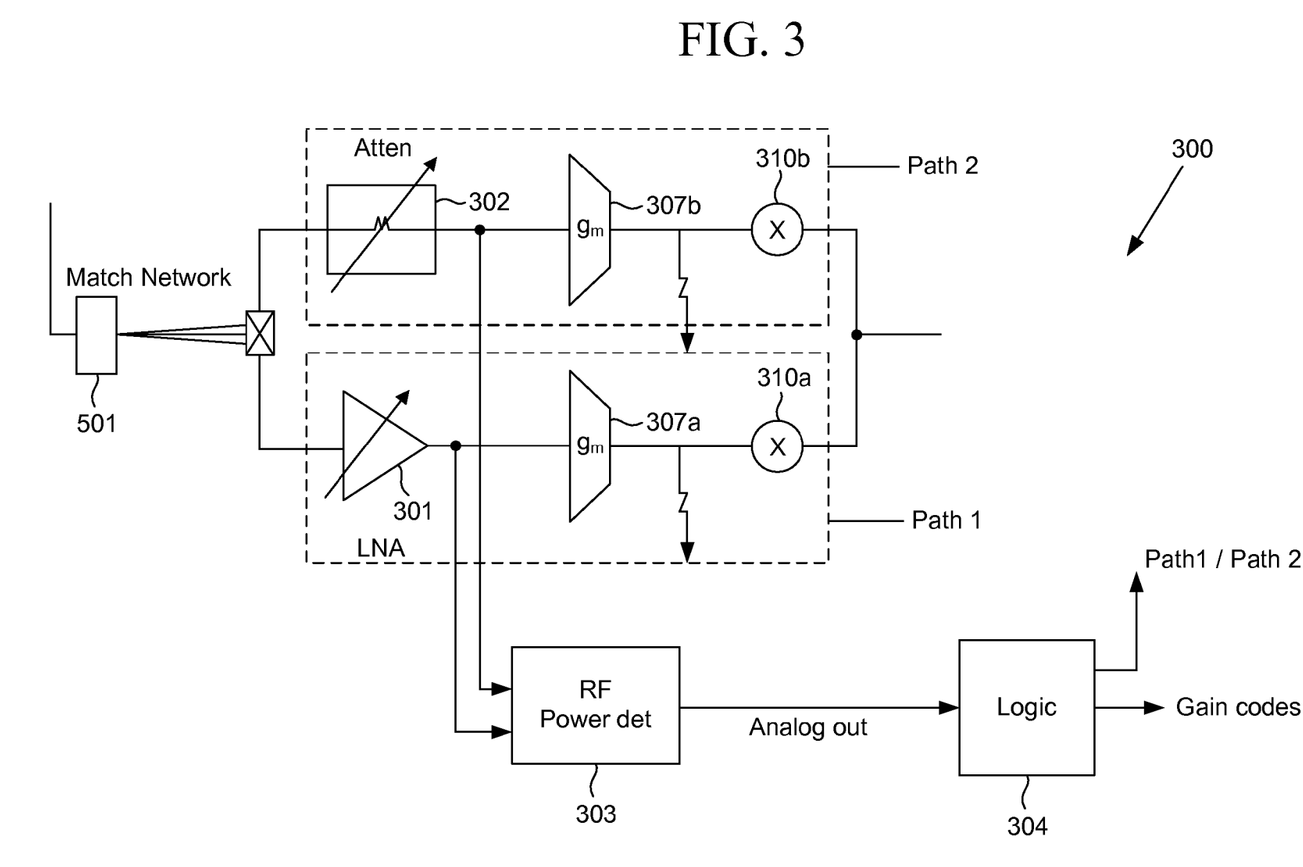
FIG. 3 illustrates a block diagram of a front end circuit according to an embodiment herein.

FIG. 3 shows a basic block diagram of the front end circuit 300 according to the embodiments herein. A matching network 501 is operatively connected to each of two signal paths. The two signal paths (Path 1 and Path 2) that can be taken are the LNA and attenuator paths, respectively. Both paths extend all the way through transconductor stages 307a, 307b and to the mixer outputs 310a, 310b before recombining and only one path is turned on at a time. The reason that the LNA 301 and attenuator 302 do not usually combine directly at their outputs, is that signal coupling through the LNA 301 when it is off could still override the smaller signal at the output of the attenuator 302 limiting its range.

An RF power detector 303 takes its inputs from both the LNA 301 and attenuator 302 outputs and uses the signal strength information to vary the front end gain. While both the LNA 301 and attenuator 302 have their "gain ranges", it is the function of the power detector 303 to step through their gain ranges and notify the logic blocks 304 to switch over from the domain of the LNA 301 to the domain of the attenuator 302.

Figure 4:
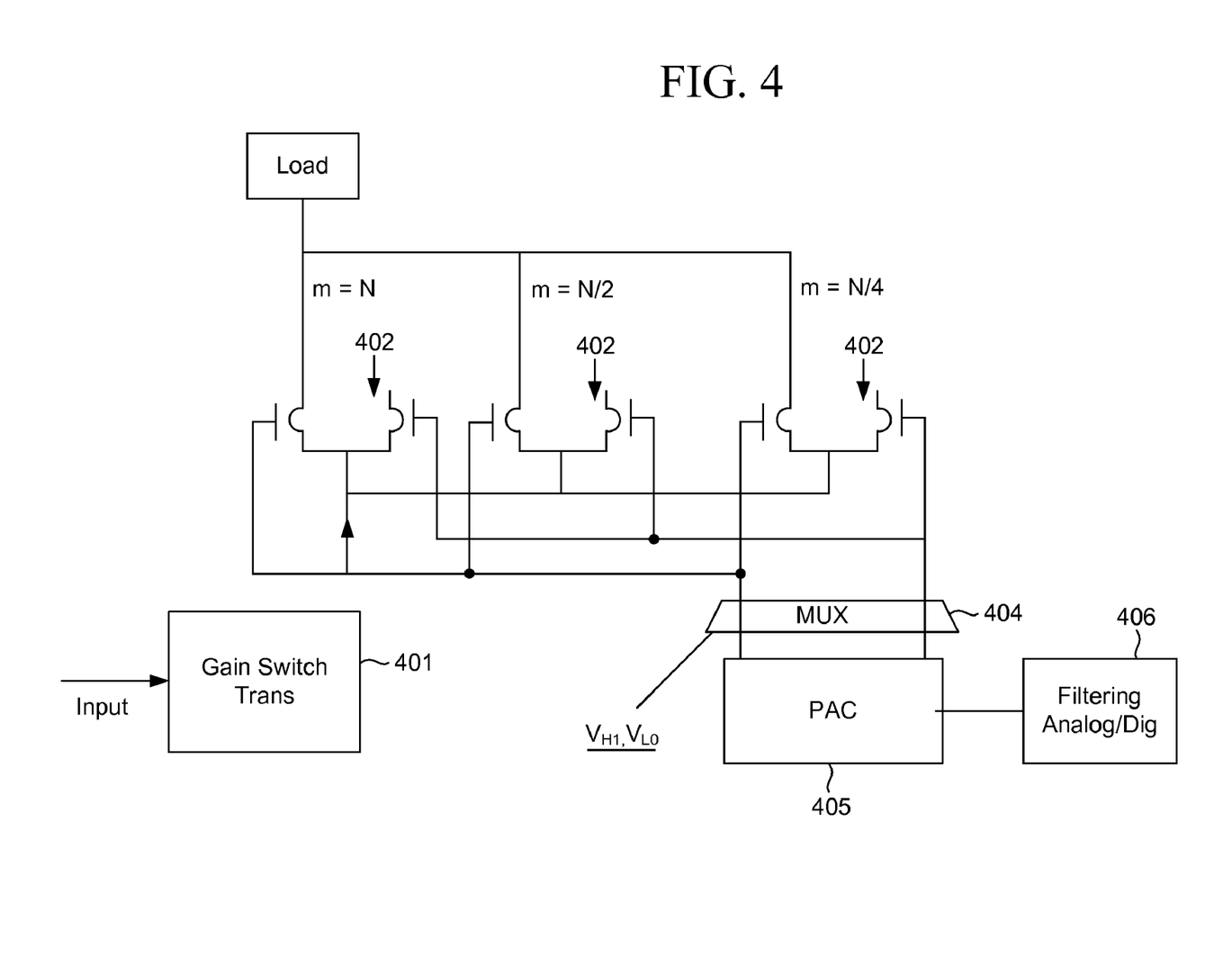
FIG. 4 is a schematic diagram illustrating fine gain stepping of the LNA of FIG. 3 according to an embodiment herein.

The LNA 301 is fine gain stepped as shown in FIG. 4. The gain stage transistors 401 have their signal currents diverted away depending on a steering pair's input voltages. Preferably, there are six banks of steering columns 402 with various weights that perform 6 dB switches each. In addition, a DAC 405 varies its input voltages to the steering column 402 in small voltage steps until it traverses the entire voltage range of the steering column 402.

Analog or digital filters 406 can be used to smooth out the output response of the DAC 405 to the LNA 301 (of FIG. 3) so as not to cause a sudden glitch in the output of the LNA 301 while fine gain stepping. Also extra retiming logic is included just before the DAC 405 to ensure thermometer coding and proper timing so that each time a gain transition occurs, it minimizes the glitch as much as possible. Also, since linearity is dramatically reduced in the middle of the DAC range compared to the ends, the logic directs the fine stepping to continue until the entire 6 dB range is obtained per steering pair.

Finally, a DAC Mux 404 is included in the topology so that at small signal levels, the LNA 301 does not see any noisy environment coming from the DAC 405 and its switches 401. When the signal level is small, and the LNA gain does not have to switch; a steady DC value is provided to the LNA 301 through the DAC 405 from a separate source. Similarly, when the LNA 301 is switched through its 6 dB at a time, a low DC voltage is provided to prevent any noise coupling into the DAC 405 from affecting the LNA 301.

Figure 5:
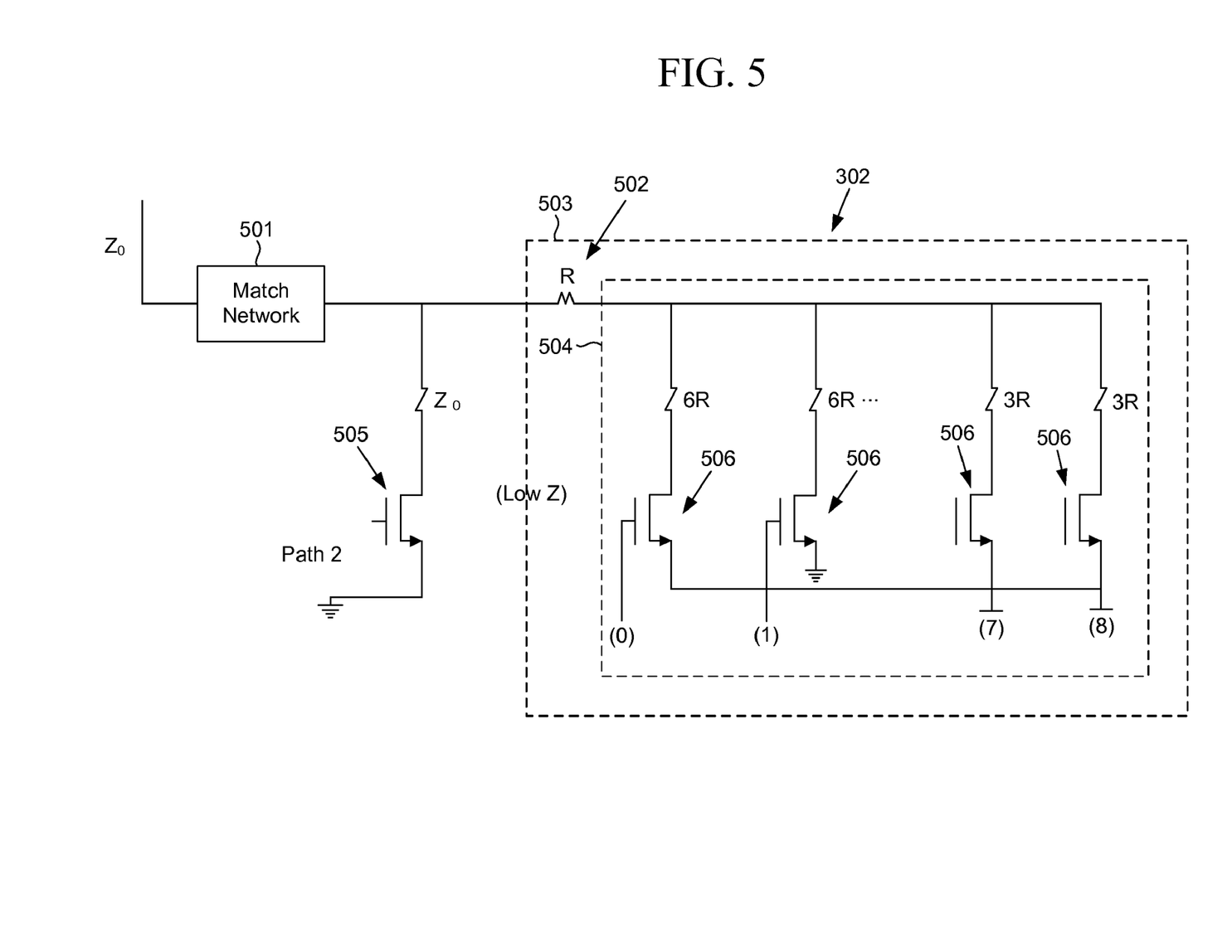
FIG. 5 illustrates a schematic diagram of the attenuator of FIG. 3 according to an embodiment herein.

FIG. 5 shows the topology of the attenuator 302 (of FIG. 3) in a 1 dB implementation. First, the matching 501 and resistive 503 topology are decoupled from each other through a matching resistor 502 in shunt with the signal. There is an enabled transistor 505 which creates high impedance when the attenuator path (Path 2) is not enabled. This will not disturb the LNA path (Path 1) when it is in operation.

Second, instead of a conventional R-2R ladder, a simple resistive divider 504 is used with the switches 506 in shunt with the signal. This is desirable because it minimizes the transistor switches in series with the signal path, and dramatically improves the linearity. Separate ground paths are utilized for the matching transistor 505 versus the attenuator transistors 506. This is because the signal is usually large at the matching transistor's downbond ground and could easily limit the attenuator range if it were its ground.

As the attenuator 302 acquires information from the logic 304 (of FIG. 3) to reduce its gain, more shunt transistors 506 are switched in, one at a time. These switch transistors 506 are adapted to minimize its off state capacitance while still providing a sufficiently small resistance in its on state compared to the resistance being switched.

Figure 6A:
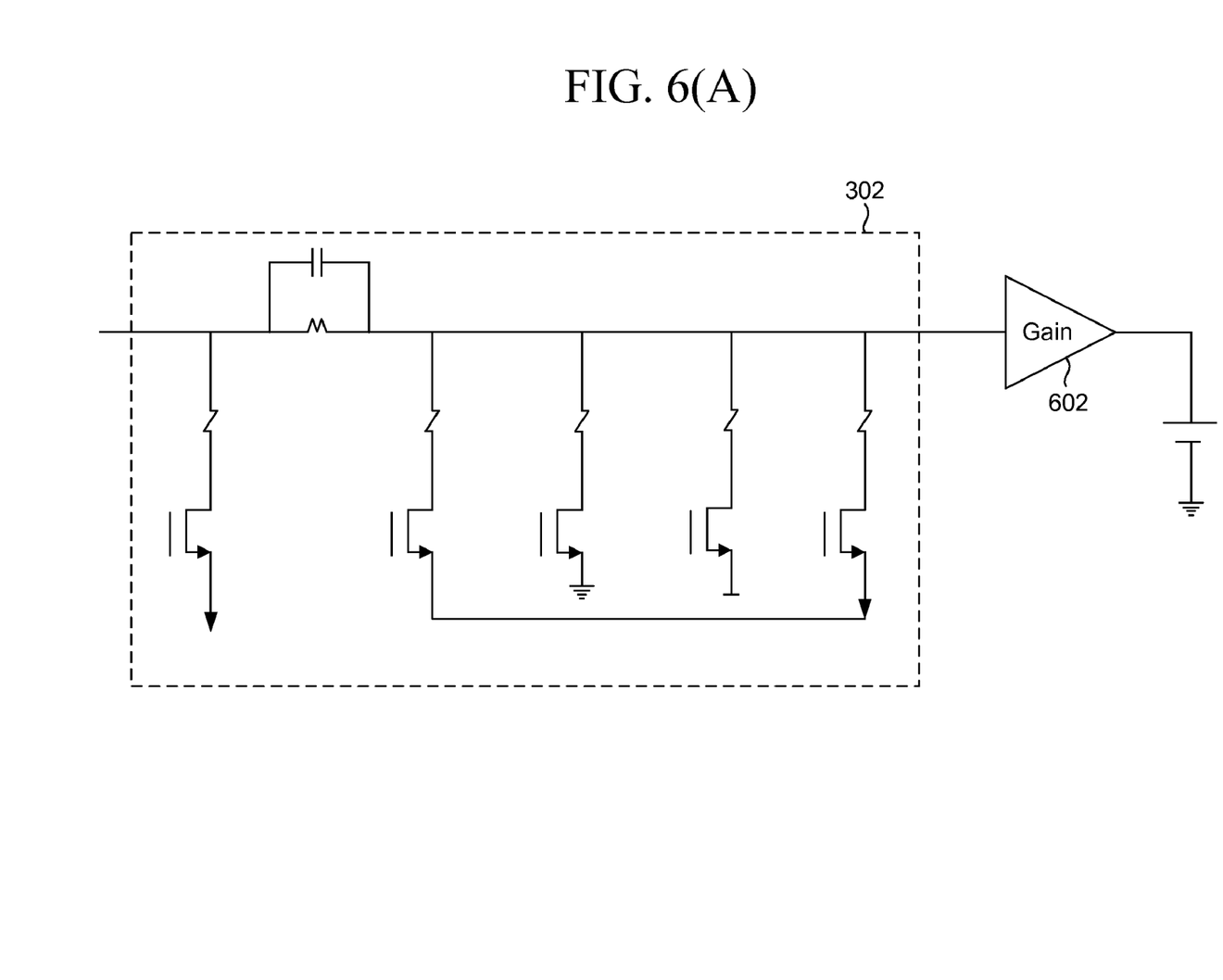
FIGS. 6(A) and 6(B) illustrate schematic diagrams of a distributed attenuator topology according to an embodiment herein.
Figure 6B:
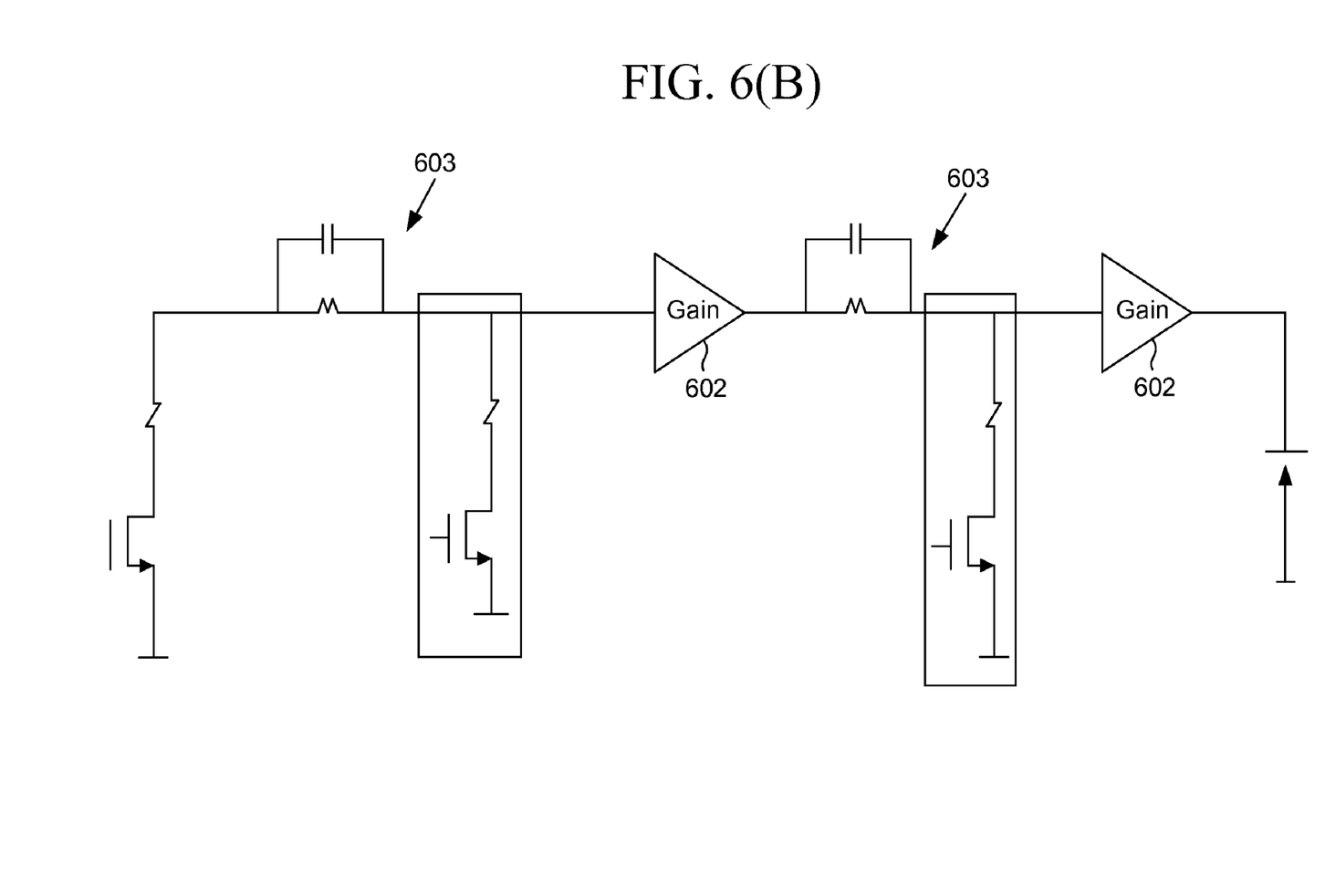

With reference to FIGS. 6(A) and 6(B), in order to improve the operating bandwidth of the attenuator 301, especially when loaded with the subsequent stage, a high linearity Gm-R stage 602 buffers between the output of the attenuator 302 and presents a low output capacitance to the attenuator 302. This technique can be extended to distributed attenuators 302 as indicated in FIG. 6(A) where the attenuator range is broken up into halves or thirds with more buffers 602. In addition, bandwidth boosting can be achieved by adding series/shunt capacitors 603 as illustrated in FIG. 6(B).

With respect to the fine gain stepping and voltage bias control, the logic circuitry 304 (of FIG. 3) respond to two streams of information (from the LNA path and the attenuator path). The RF power detector 303 recalls both the signal and the blocker information, while the automatic gain control (AGC) voltage recalls only the desired signal information. This can be used to extract the nature of the signal and the form of action needed to change the gain.

Figure 7:
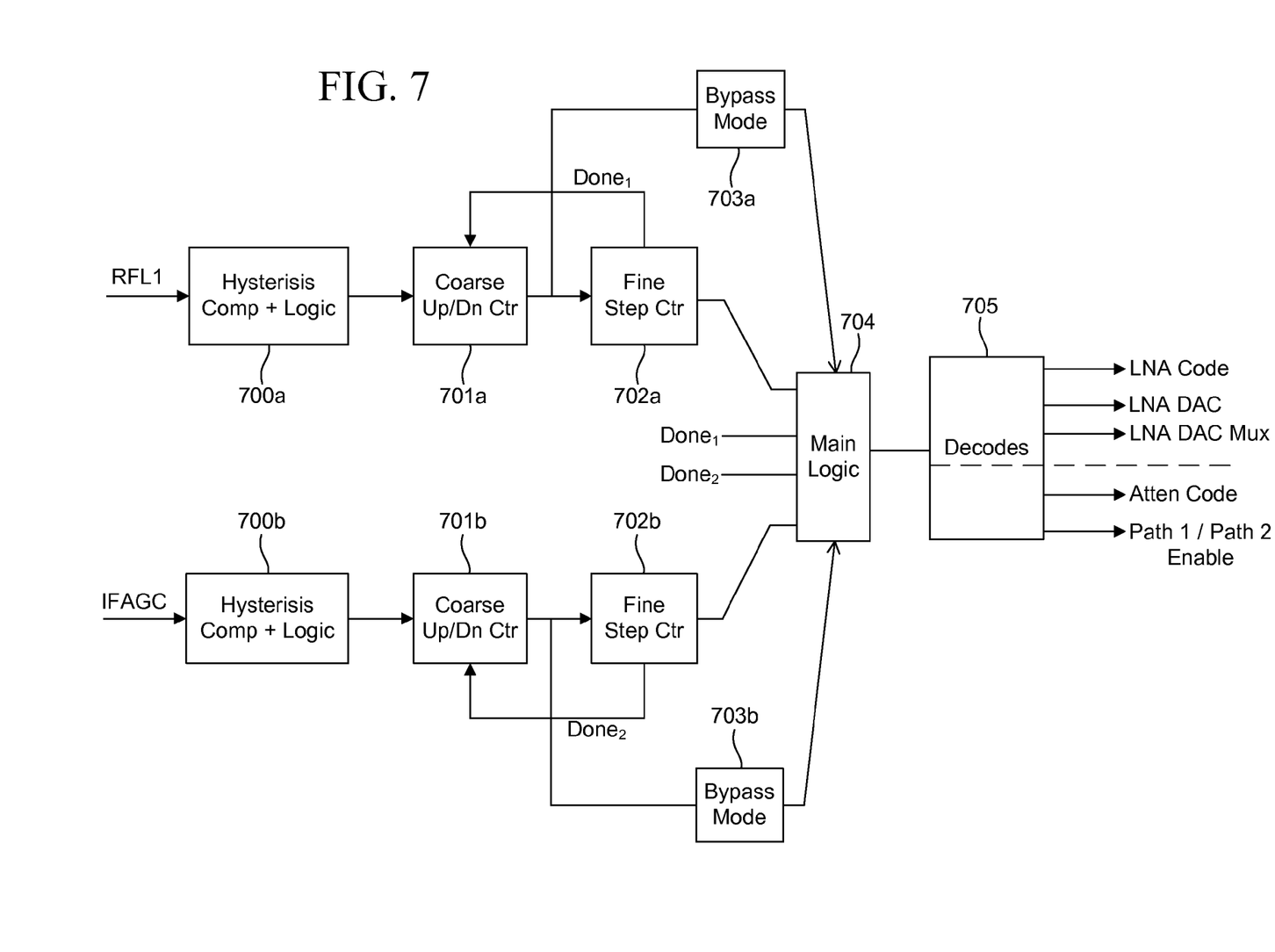
FIG. 7 illustrates a block diagram of a gain stepping methodology according to an embodiment herein.

Since the signal can increase or decrease in strength with different fading profiles, the logic circuitry 304 is adapted to be amenable to up or down stepping as soon as possible. For this reason, as shown in FIG. 7, an up-down counter 701a, 701b is used in each of the two streams of information. It responds to a set of comparators 700a, 700b at the input of the logic circuitry 304. These comparators 700a, 700b demarcate a set of ranges that each have different consequences on the gain. They involve changing up/down the gain or keeping the gain the same. This effectively creates a hysterisis boundary that prevents gain limit cycles from occurring.

The output of the up/down counters 701a, 701b is in close feedback with a fine step counter 702a, 702b that takes each coarse step and creates fine graticule steps that transition between each coarse step. When it is finished with its fine stepping, a signal is sent back to the coarse step to resample the front end comparators 700a, 700b. If fine stepping and coarse stepping are to be performed at different times on the same chip, a bypass mode 703a, 703b can be added to prevent interaction with the fine step counters 702a, 702b.

The minimum logic block 304 combines the inputs from the two streams as follows. Since it is undesirable from a linearity perspective to change the gain action during the middle of a coarse step transition, the minimum logic block 304 only decides whether to switch when either of the fine step counters 702a, 702b are performed. When that occurs, the logic block 304 checks which of the input gain streams are lower in gain value, and steers the output gain stream towards that value.

The decoder 705, which is a subset of power detector 303 of FIG. 3, takes the final logic stream and processes it to determine whether the LNA path (Path 1) or the attenuator path (Path 2) is to be gain switched and by how much of a gain step. This is fed directly to the RF path through a retimer logic circuit (not shown) that prevents step.

Figure 8:
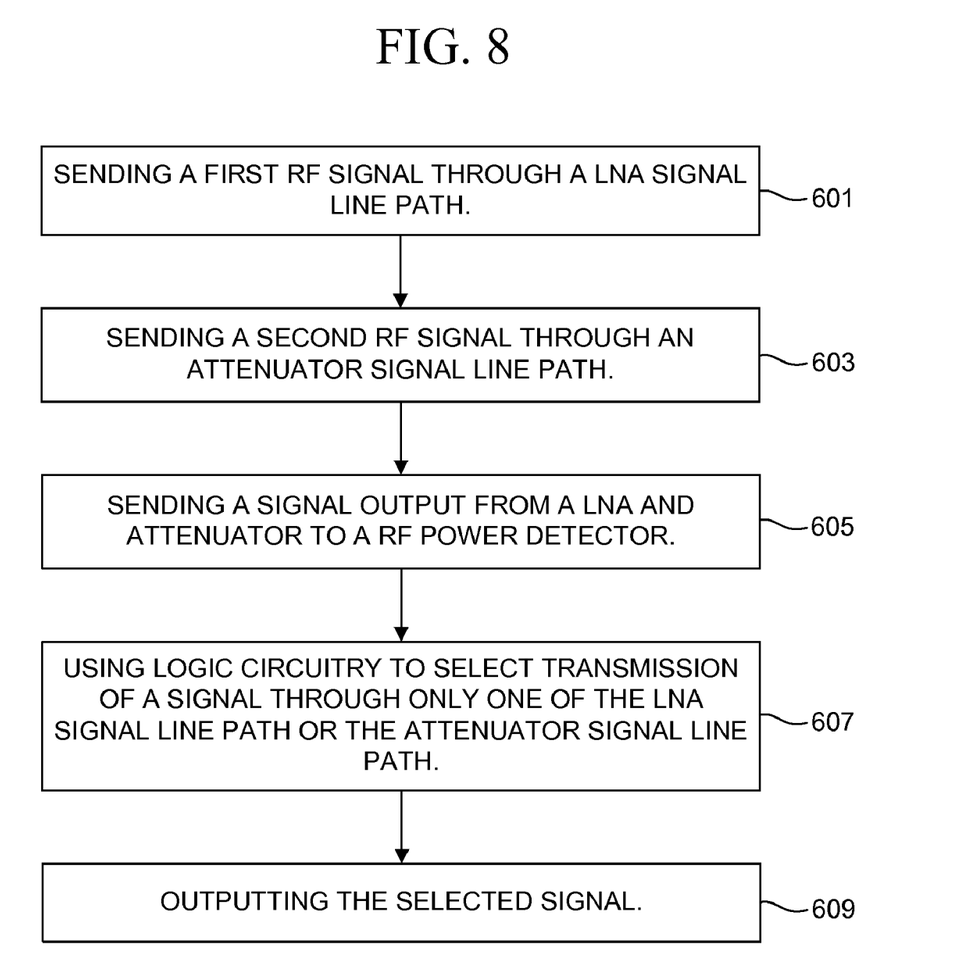
FIG. 8 is a flow diagram illustrating a preferred method according to an embodiment herein.

FIG. 8, with reference to FIGS. 3 through 7, is a flow diagram illustrating a method for fine gain stepping and voltage bias control in an electrical circuit 300 according to an embodiment herein, wherein the method comprises sending (801) a first RF signal through a LNA signal line path (Path 1), wherein the LNA signal line path comprises a LNA 301; a first transconductor stage 307a operatively connected to the LNA 301; and a first signal mixer 310a operatively connected to the first transconductor stage 307a. The method further comprises sending (803) a second RF signal through an attenuator signal line path (Path 2), wherein the attenuator signal line path comprises an attenuator 302; a second transconductor stage 307b operatively connected to the attenuator 302; and a second signal mixer 310b operatively connected to the second transconductor stage 307b. The method further comprises sending (805) a signal output from each of the LNA 301 and the attenuator 302 to a RF power detector 303, wherein the RF power detector 303 is adapted to vary a front end power gain of the electrical circuit 300; using (807) logic circuitry 304 to select transmission of a signal through only one of the LNA signal line path or the attenuator signal line path; and outputting (809) the selected signal.

Preferably, the logic circuitry 304 is adapted to receive instructions from the RF power detector 303 to switch between a LNA signal domain and an attenuator signal domain. Moreover, a power gain of the LNA 301 is preferably stepped such that signal glitches through the outputted selected signal is minimized. The method may further comprise buffering an output signal from the attenuator 302 in order to lower an output capacitance of the attenuator 302. Additionally, the method may further comprise dividing the attenuator 302 into sub-sections separated from one another by a buffer 602.

The embodiments herein can include both hardware and software elements. The software embodiments preferably include, but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 9:
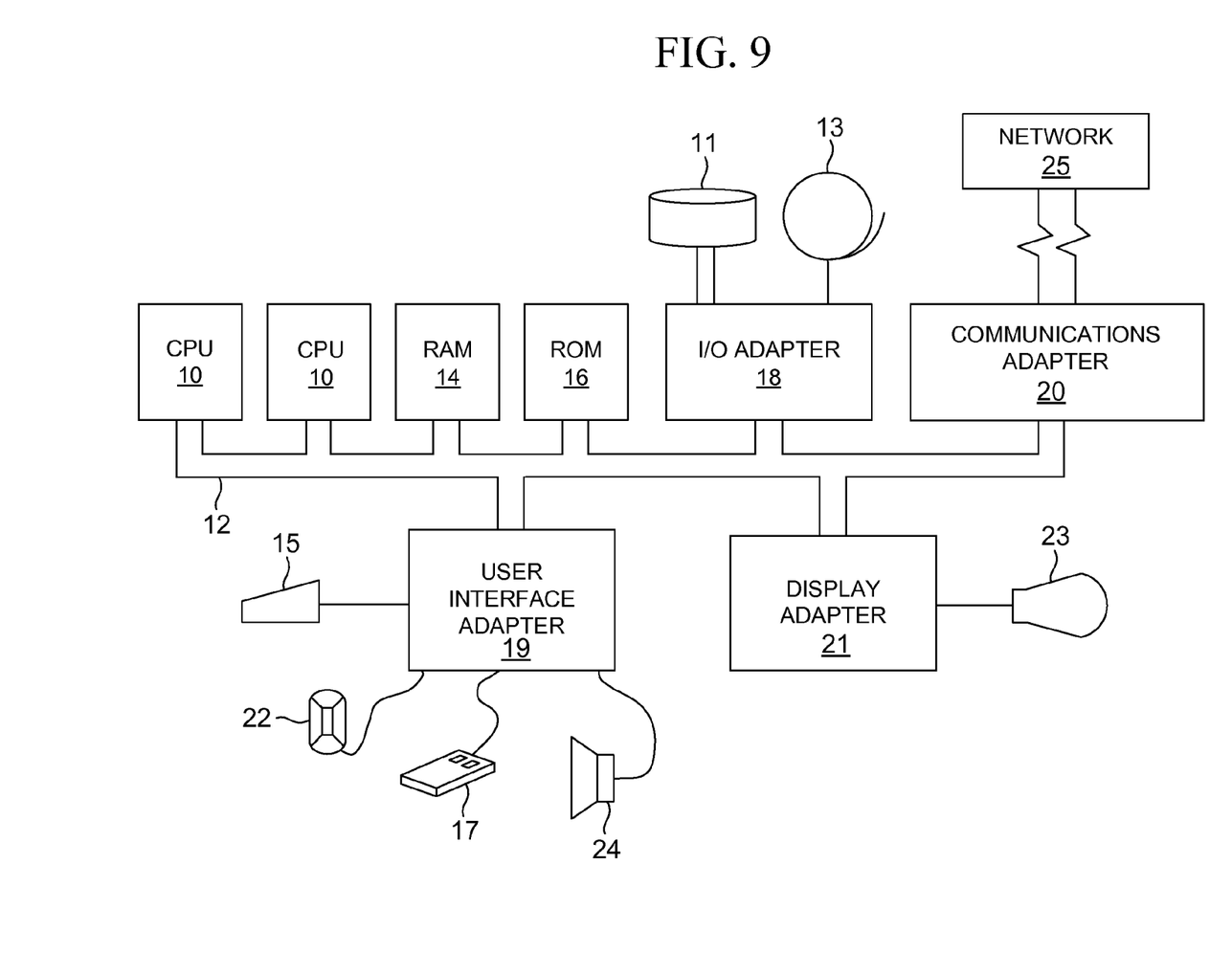
FIG. 9 illustrates a schematic diagram of a computer system according to an embodiment herein.

A representative hardware environment for practicing the embodiments herein is depicted in FIG. 9. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The embodiments herein provide a circuit that can trade off between high linearity and low noise figure depending on signal strength, while still having fine gain, step control to prevent signal glitches in the demod circuit following the tuner. Moreover, the embodiments herein can be used in any front end design where high linearity is required with fine gain step control. The embodiment herein are further applicable to all RF protocol standards, be it wideband or narrowband, including mobile television (TV) and cellular standards. Additionally, the embodiments herein are also amenable to dual chip control, as in the case with a host processor in the demod.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

The techniques provided by the embodiments herein may also be implemented on printed circuit board (PCB) using discrete components. In this case, the electronic circuit components described herein, such as adder circuit, digital infinite impulse response (IIR) or finite impulse response (FIR) circuit, comparator circuit, metal-oxide-semiconductor field-effect transistor (MOSFET) pair, analog low-pass filter, can use discrete components and these discrete components are electronically connected on the printed circuit board to perform the functions described herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An electrical circuit comprising:
    a low noise amplifier (LNA) signal line path comprising:
        an LNA; and
        a first signal mixer operatively connected to said LNA;
    an attenuator signal line path comprising:
        an attenuator; and
        a second signal mixer operatively connected to said attenuator;
    a radio frequency (RF) power detector operatively connected to an output of each of said LNA and said attenuator, wherein said RF power detector varies a front end power gain of said electrical circuit; and
    logic circuitry operatively connected to said RF power detector, wherein said logic circuitry (i) selects transmission of a signal through only one of said LNA signal line path or said attenuator signal line path, and (ii) outputs the selected signal.

2. The electrical circuit of claim 1, wherein said logic circuitry receives instructions from said RF power detector to switch between a LNA signal domain and an attenuator signal domain.

3. The electrical circuit of claim 1, wherein a power gain of said LNA is stepped such that signal glitches through the outputted selected signal is minimized.

4. The electrical circuit of claim 1, wherein said attenuator comprises a matching resistor in shunt with a signal through said attenuator signal line path.

5. The electrical circuit of claim 1, wherein said attenuator comprises a resistive divider configuration comprising transistor switches in shunt with a signal through said attenuator signal line path.

6. The electrical circuit of claim 1, further comprising a buffer operatively connected to said attenuator to lower an output capacitance of said attenuator.

7. The electrical circuit of claim 1, wherein said attenuator is divided into sub-sections separated from one another by a buffer.

8. The electrical circuit of claim 1, wherein each of said LNA signal line path and said attenuator signal line path further comprises:
- an up-down counter; and
- a fine gain step counter in a feedback configuration with said up-down counter.

9. A system configured for a communications device, said system comprising:
- an antenna that receives a radio frequency (RF) signal;
- a matching network that processes said RF signal;
- a low noise amplifier (LNA) signal line path operatively connected to said matching network, said LNA signal line path comprising:
  - an LNA;
  - a first transconductor stage operatively connected to said LNA; and
  - a first signal mixer operatively connected to said first transconductor stage;
- an attenuator signal line path operatively connected to said matching network, said attenuator signal line path comprising:
  - an attenuator;
  - a second transconductor stage operatively connected to said attenuator; and
  - a second signal mixer operatively connected to said second transconductor stage;
- a RF power detector operatively connected to an output of each of said LNA and said attenuator, wherein said RF power detector varies a front end power gain of said system; and
- logic circuitry operatively connected to said RF power detector, wherein said logic circuitry (i) selects transmission of a signal through only one of said LNA signal line path or said attenuator signal line path, and (ii) outputs the selected signal,
- wherein each of said LNA signal line path and said attenuator signal line path comprises:
  - a comparator that creates a hysteresis boundary for preventing power gain limit cycles from occurring in each of said LNA signal line path and said attenuator signal line path;
  - an up-down counter operatively connected to said comparator; and
  - a fine gain step counter in a feedback configuration with said up-down counter.

10. The system of claim 9, wherein said logic circuitry receives instructions from said RF power detector to switch between a LNA signal domain and an attenuator signal domain.

11. The system of claim 9, wherein a power gain of said LNA is stepped such that signal glitches through the outputted selected signal are minimized.

12. The system of claim 9, wherein said attenuator comprises a matching resistor in shunt with a signal through said attenuator signal line path.

13. The system of claim 9, wherein said attenuator comprises a resistive divider configuration comprising transistor switches in shunt with a signal through said attenuator signal line path.

14. The system of claim 9, further comprising a buffer operatively connected to said attenuator to lower an output capacitance of said attenuator.

15. The system of claim 9, wherein said attenuator is divided into sub-sections separated from one another by a buffer.

16. A method for fine gain stepping and voltage bias control in an electrical circuit, said method comprising:
- sending a first radio frequency (RF) signal through a low noise amplifier (LNA) signal line path, wherein said LNA signal line path comprises:
  - an LNA;
  - a first transconductor stage operatively connected to said LNA; and
  - a first signal mixer operatively connected to said first transconductor stage;
- sending a second RF signal through an attenuator signal line path, wherein said attenuator signal line path comprises:
  - an attenuator;
  - a second transconductor stage operatively connected to said attenuator; and
  - a second signal mixer operatively connected to said second transconductor stage;
- sending a signal output from each of said LNA and said attenuator to a RF power detector, wherein said RF power detector varies a front end power gain of said electrical circuit;
- using logic circuitry to select transmission of a signal through only one of said LNA signal line path or said attenuator signal line path; and
- outputting the selected signal.

17. The method of claim 16, wherein said logic circuitry receives instructions from said RF power detector to switch between a LNA signal domain and an attenuator signal domain.

18. The method of claim 16, wherein a power gain of said LNA is stepped such that signal glitches through the outputted selected signal are minimized.

19. The method of claim 16, further comprising buffering an output signal from said attenuator in order to lower an output capacitance of said attenuator.

20. The method of claim 16, further comprising dividing said attenuator into sub-sections separated from one another by a buffer.

* * * * *

UNITED STATES PATENT AND TRADEMARK OFFICE
CERTIFICATE OF CORRECTION

PATENT NO.        : 7,711,334 B2
APPLICATION NO.   : 11/690149
DATED             : May 4, 2010
INVENTOR(S)       : Sivasubramaniam It is certified that error appears in the above-identified patent and that said Letters Patent is hereby corrected as shown below:

In the Drawings

Title page, illustrative fig. 8 should be deleted and substitute therefore the attached title page Consisting of illustrative fig. 8.

The drawing sheets 4 of 10 and 9 of 10 consisting of Fig(s) 4 and 8 should be deleted and substitute therefore the attached drawing sheets 4 of 10 and 9 of 10 consisting of replacement Fig(s) 4 and 8.

In FIG. 4, block 405, please delete "PAC" and in its place, please insert --DAC--.

In FIG. 8, please delete element reference numeral "601" and in its place, please insert --801--.

In FIG. 8, please delete element reference numeral "603" and in its place, please insert --803--.

In FIG. 8, please delete element reference numeral "605" and in its place, please insert --805--.

In FIG. 8, please delete element reference numeral "607" and in its place, please insert --807--.

In FIG. 8, please delete element reference numeral "609" and in its place, please insert --809--.

In column 5, line 4, please delete "301" and in its place, please insert --302--.

Signed and Sealed this
Fourth Day of September, 2012

David J. Kappos
*Director of the United States Patent and Trademark Office*

(12) United States Patent
Sivasubramaniam (10) Patent No.: US 7,711,334 B2
(45) Date of Patent: May 4, 2010

(54) HIGH LINEARITY, LOW NOISE FIGURE, FRONT END CIRCUIT WITH FINE STEP GAIN CONTROL

(75) Inventor: Janakan Sivasubramaniam, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 516 days.

(21) Appl. No.: 11/690,149

(22) Filed: Mar. 23, 2007

(65) Prior Publication Data
US 2008/0233913 A1 Sep. 25, 2008

(51) Int. Cl.
*G06F 3/033* (2006.01)
*H04B 1/18* (2006.01)

(52) U.S. Cl. .................. 455/130; 455/293; 455/280

(58) Field of Classification Search .......... 455/130, 455/323, 330, 326, 189.1, 293, 311, 280
See application file for complete search history.

(56) References Cited

U.S. PATENT DOCUMENTS

| | | | |
|---|---|---|---|
| 6,744,320 B2 | 6/2004 | Nguyen et al. | |
| 6,781,467 B2 * | 8/2004 | Sun | 330/295 |
| 7,035,616 B2 * | 4/2006 | Reynolds | 455/326 |
| 7,088,169 B2 * | 8/2006 | Erba et al. | 327/359 |
| 7,317,357 B1 * | 1/2008 | Zou | 330/254 |
| 7,403,071 B2 * | 7/2008 | Hollenbeck et al. | 330/254 |
| 7,471,140 B2 * | 12/2008 | Salerno | 327/551 |
| 7,529,529 B2 * | 5/2009 | Taylor | 455/130 |
| 7,541,875 B2 * | 6/2009 | Taylor et al. | 330/311 |
| 7,542,812 B2 * | 6/2009 | Stroili et al. | 700/90 |
| 2003/0027543 A1 | 2/2003 | Takaki | |
| 2004/0036772 A1 | 2/2004 | Pugel et al. | |
| 2005/0265428 A1 * | 12/2005 | McCorkle | 375/130 |
| 2006/0071845 A1 | 4/2006 | Stroili et al. | |

OTHER PUBLICATIONS

Ironi, A., "Mobile TV standards: One size doesn't fit all," http://www.totaltele.com/View.aspx?ID=91546&t=4, Apr. 17, 2007.

* cited by examiner

*Primary Examiner*—Sonny Trinh
(74) *Attorney, Agent, or Firm*—Rahman LLC (57) ABSTRACT

A system, method, and electrical circuit comprises a LNA signal line path comprising a LNA and a first signal mixer operatively connected to the LNA. The circuit further comprises an attenuator signal line path comprising an attenuator and a second signal mixer operatively connected to the attenuator; a radio frequency (RF) power detector operatively connected to an output of each of the LNA and the attenuator, wherein the RF power detector is adapted to vary a front end power gain of the electrical circuit; and logic circuitry operatively connected to the RF power detector, wherein the logic circuitry is adapted to (i) select transmission of a signal through only one of the LNA signal line path or the attenuator signal line path, and (ii) output the selected signal.

20 Claims, 10 Drawing Sheets

FIG. 4

FIG. 8